United States Patent [19]

Nakatsuka et al.

[11] Patent Number: 5,568,264
[45] Date of Patent: Oct. 22, 1996

[54] EXTERIOR VIEW INSPECTING APPARATUS FOR CIRCUIT BOARD

[75] Inventors: Shigeki Nakatsuka, Kyoto; Iwao Ichikawa, Nishinomiya; Manabu Morioka, Nara; Kenji Kato; Takayuki Fujita, both of Hirakata; Shigetoshi Negishi, Suita; Kazuhiro Shiga, Hirakata, all of Japan

[73] Assignee: Matsushita Electric Industrial Co., Ltd., Osaka, Japan

[21] Appl. No.: 515,624

[22] Filed: Aug. 16, 1995

Related U.S. Application Data

[63] Continuation of Ser. No. 177,516, Jan. 4, 1994, abandoned.

[30] Foreign Application Priority Data

Jan. 7, 1993 [JP] Japan ................................. 5-001036
Dec. 9, 1993 [JP] Japan ................................. 5-309092

[51] Int. Cl.$^6$ .................................................. G01B 11/00
[52] U.S. Cl. ............................. 356/394; 356/237; 356/398
[58] Field of Search ............................. 356/372, 373, 356/375, 376, 394, 398, 237; 250/561, 562, 563, 572; 348/87, 90, 94, 125, 126

[56] References Cited

U.S. PATENT DOCUMENTS

| | | | |
|---|---|---|---|
| 3,154,626 | 10/1964 | Sisson | 356/375 |
| 3,210,546 | 10/1965 | Perron | 356/237 |
| 3,589,815 | 6/1971 | Hosterman | 356/375 |
| 4,240,750 | 12/1980 | Kurtz et al. | 356/394 |
| 5,329,359 | 7/1994 | Tachikawa | 356/394 |

FOREIGN PATENT DOCUMENTS

| | | |
|---|---|---|
| 0365182 | 4/1990 | European Pat. Off. . |
| 91-11290 | 8/1991 | WIPO . |

OTHER PUBLICATIONS

Koezuka et al., "High–Speed, Wide Area 3–D Vision System for PWB Inspection", Fujitsu Sci. Tech. Journal, 26, 1, pp. 16–25 (Apr. 1990).

*Primary Examiner*—Hoa Q. Pham
*Attorney, Agent, or Firm*—McDermott, Will & Emery

[57] ABSTRACT

The exterior view inspecting apparatus for circuit board of the invention including a sensor unit for emitting a laser beam to an object to be inspected, and detecting the displacement of the object by focusing the reflected light on a photoelectric transducer by using a receiving lens; an optical path converter unit for refracting the optical path of the laser beam; a sensor head unit incorporating the sensor unit and optical path converter unit; a control unit for moving the sensor head unit along a specified scanning route; a correction unit for correcting the displacement data of the object to be inspected as detected by the sensor unit, and a judging unit for judging the existence and position of an electronic component on a circuit board from the corrected displacement data. The optical path converter unit includes a flat sheet glass inclined relative to the optical path of the laser beam, rotating about the axial center parallel to the optical path. By this optical path converter unit, the optical path of the laser beam is refracted so that the laser beam scans the circuit board drawing a small circular trace. As the trace draws a small circle, the trace detects the end portion of the electronic component on the circuit board multiple times. Consequently, the existence and position of the electronic component on the circuit board can be detected accurately.

9 Claims, 25 Drawing Sheets

MOVING DISTANCE

EXTERIOR VIEW INSPECTING APPARATUS FOR CIRCUIT BOARD

This is a continuation application of application Ser. No. 08/177,516 filed Jan. 4, 1994, now abandoned.

FIELD OF THE INVENTION

The present invention relates to an exterior view inspecting apparatus for circuit board for detecting the existence and position of an electronic component on a circuit board.

BACKGROUND OF THE INVENTION

FIG. 38 shows a conventional exterior view inspecting apparatus for circuit board.

A displacement sensor 11 detects the existence and position of an electronic component on a circuit board. An X-axis robot 25 and a Y-axis robot 27 moves the displacement sensor 11. A pair of conveyors 30 disposed parallel convey a circuit board 4. A sensor 35 detects the arrival of the circuit board 4. A fixer 40 fixes the circuit board 4 so that it may not move during inspection. A controller 2 is connected through a signal cable 8, and controls this apparatus.

As shown in FIG. 39, the X-axis robot 25 and Y-axis robot 27 move the displacement sensor 11 according to the position data of an electronic component 5 stored in the controller 2.

The displacement sensor 11 scans the circuit board 4 along the route containing the electronic component 5, once in the X- or Y-direction with a laser beam.

By this scanning, the change in distance between the displacement sensor 11 and the circuit board 4 on which the electronic component 5 is mounted, which is called a displacement hereinafter, is detected FIG. 40(a) shows a trace 300 of the laser beam emitted by the displacement sensor 11.

FIG. 40(b) is a waveform of displacement detected by the displacement sensor 11, and level Ha denotes the circuit board 4, and level Hb shows the electronic component 5. By a threshold value 301 set between level Ha and level Hb, both ends L1 and L2 of the electronic component 5 are detected.

The exterior view inspecting apparatus for circuit board judges the existence of the electronic component 5 if both L1 and L2 are present, and judges the absence of the electronic component 5 if neither L1 nor L2 is present.

Furthermore, the exterior view inspecting apparatus for circuit board judges that the electronic component 5 is at a correct position if both L1 and L2 are in a predetermined area, and judges that the electronic component 5 is at a wrong position if L1 and/or L2 is outside the predetermined area.

The conventional exterior view inspecting apparatus for circuit board, however, does not detect the deviation of position of the electronic component 5 indicated by broken line 5a or 5b in FIG. 40(a) because L1 and L2 in this case cannot be distinguished from the correct position of L1 and L2 of the electronic component 5 indicated by solid line.

This problem may be solved by increasing the number of scannings by the displacement sensor 11, but it requires starting and stopping of the X-axis robot and Y-axis robot on every scanning, and it gives rise to a new problem of necessity of a long time for inspection, which is not preferable.

The invention hence presents an exterior view inspecting apparatus for circuit board capable of detecting the position of an electronic component on a circuit board accurately and in a short time.

SUMMARY OF THE INVENTION

The exterior view inspecting apparatus for circuit board of the invention comprises:

a sensor unit for emitting laser beam to an object to be inspected, and detecting the displacement of the object by focusing the reflected light on an photoelectric transducer by using a receiving lens, an optimal path converter unit for refracting the optical path of radiation laser beam, a sensor head unit incorporating the sensor unit and the optical path converter unit, a control unit for moving the sensor head unit along a specified scanning route, a correction unit for correcting the displacement data of the object to be inspected detected by the sensor unit, and a judging unit for judging the existence and position of an electronic component on a circuit board from the corrected displacement data.

The optical path converter unit comprises a flat glass plate inclined to the optical path of the radiation laser beam, rotating around the axial center parallel to the optical path.

By this optical path converter unit, the optical path of the radiation laser beam is refracted, so that the radiation laser beam scans the circuit board drawing a small circular trace. By drawing a small circular trace, the trace can detect the end portion of electronic components on the circuit board multiple times. Consequently, the existence and position of the electronic components on the circuit board can be detected more accurately.

Conventionally, the scanning was done by linear tracing, so the trace could detect the end position of the electronic component on the circuit board only twice. Therefore, the existence and position of the electronic component on the circuit board could not be detected accurately hitherto.

In other mode of the exterior view inspecting apparatus for circuit board of the invention does not have the optical path converter unit. The sensor unit of it moves drawing a small circular trace so that the trace of the radiation laser beam drawing a small circle.

DETAILED DESCRIPTION OF THE INVENTION

EXAMPLE 1

Figure 1:
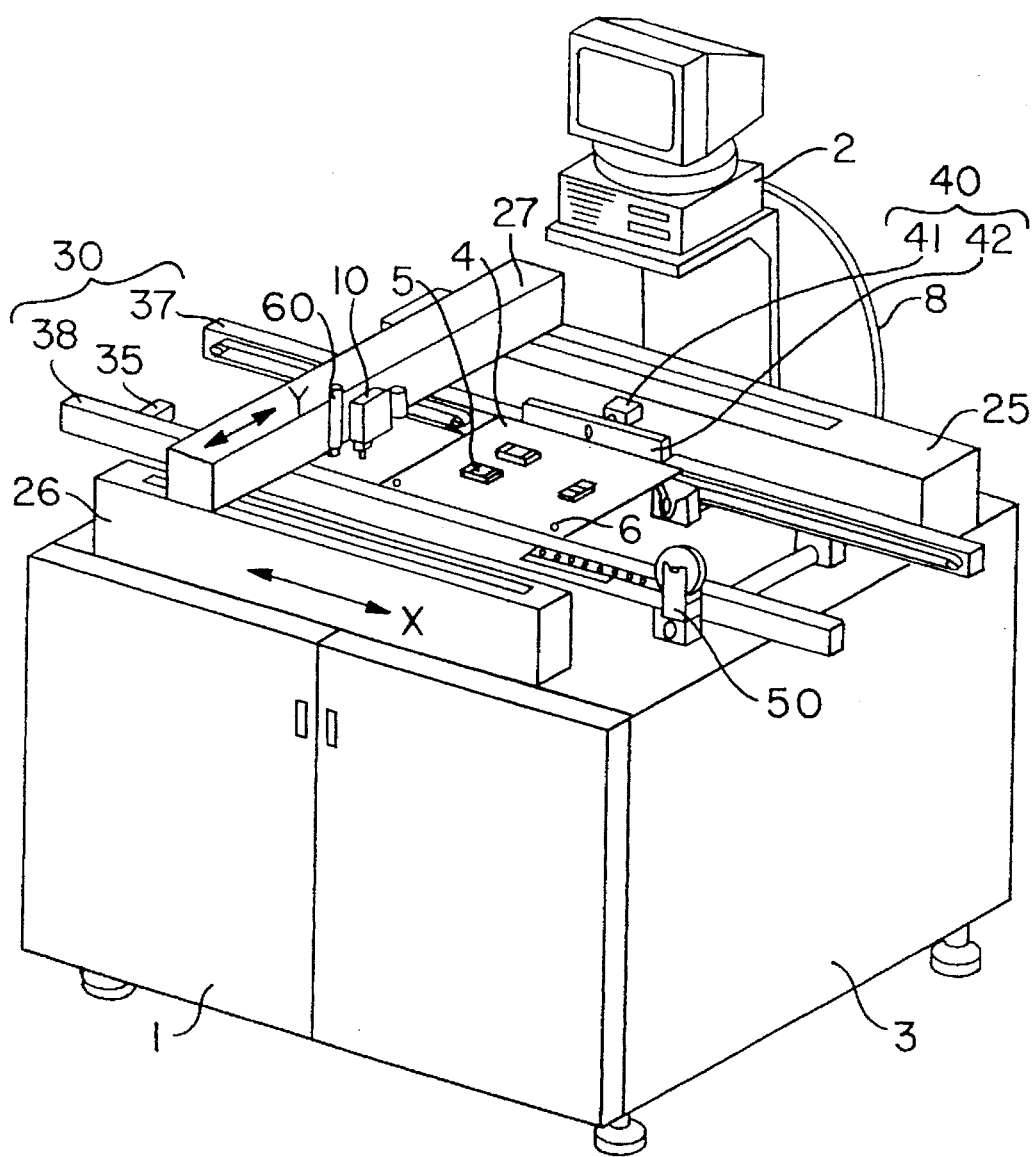
FIG. 1 is a perspective view showing the constitution of an exterior view inspecting apparatus for circuit board in a first embodiment of the invention.

FIG. 1 is a perspective view showing an exterior view inspecting apparatus for circuit board of the invention, which comprises an inspection unit 1 for detecting the existence and position of an electronic component, and a personal computer 2 for controlling the inspection unit 1.

The inspection unit 1 comprises a sensor head unit 10 for detecting an electronic component S mounted on a circuit board 4 possessing an origin hole 6, an X-axis robot 25 for moving the sensor head unit 10, an auxiliary robot 26 disposed parallel to the X-axis robot 25, a Y-axis robot 27 disposed on the auxiliary robot 26 orthogonally to the X-axis robot 25, a conveyor unit 30 consisting of a first conveyor rail 37 and a second conveyor rail 38 for conveying the circuit board 4, an arrival sensor 35 for detecting the arrival of the conveyed circuit board 4 at the detection position, a fixer 40 consisting of a cylinder 41 and a block 42 for fixing the circuit board 4 so as not to be vibrated during inspection, a sticker feeder 50 for marking a defective position, and a suction head 60 for marking the defective position with a sticker.

Figure 2:
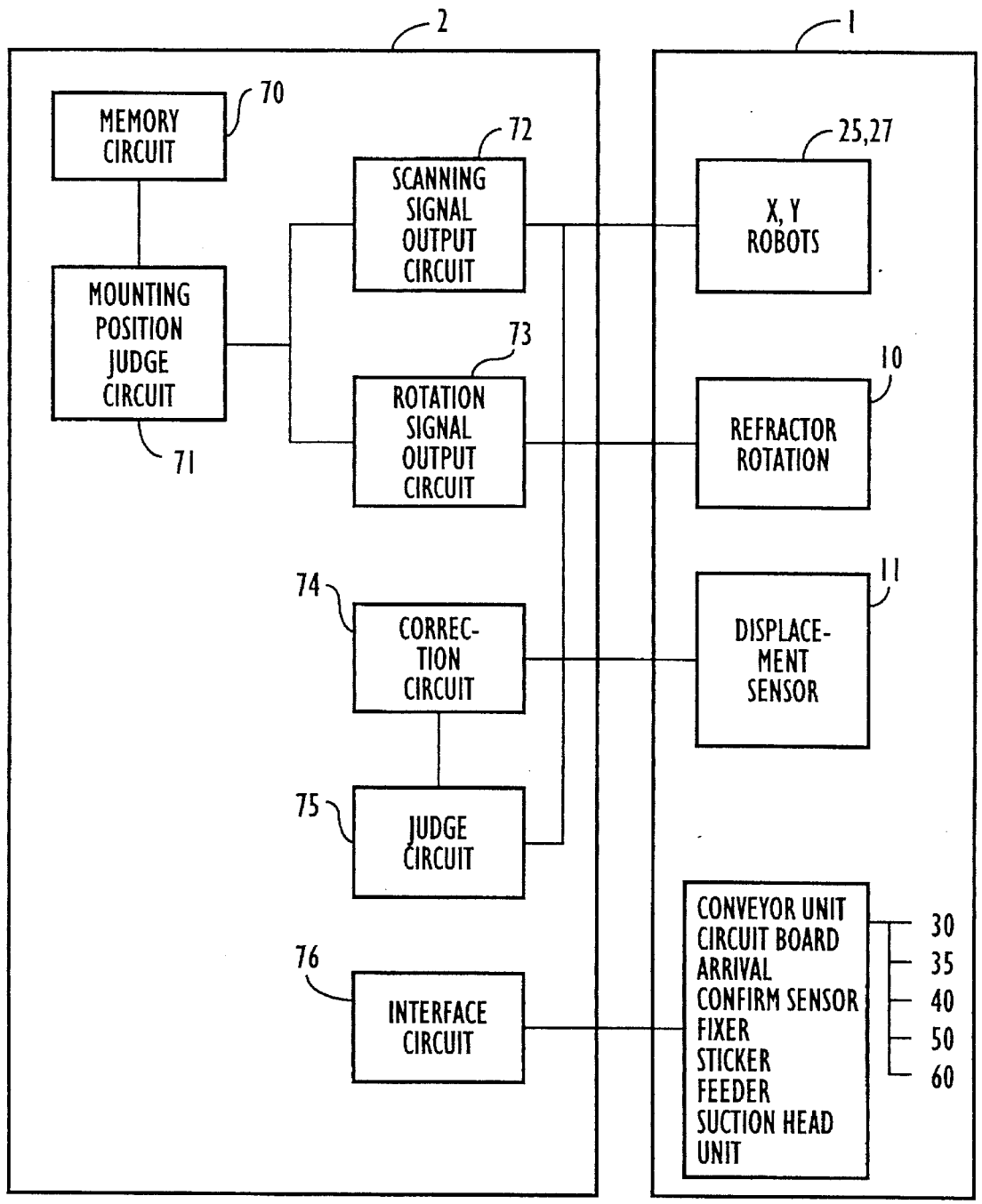
FIG. 2 is a block diagram showing the circuit constitution of the personal computer used in the same apparatus.

FIG. 2 is a block diagram showing a circuit configuration of the personal computer in a memory circuit 70, the shape of the electronic component 5, circuit board shape, mounting information position information (these are collectively called basic information) and the origin information of the circuit board 4 are stored.

A mounting position judge circuit 71 issues the shape and mounting direction of the electronic component 5. A scanning signal output circuit 72 controls the X-axis robot 25 and Y-axis robot 27 by the information from the mounting position judge circuit 71. A rotation signal output circuit 73 controls the rotation of a refractor of the sensor head unit 10 by the information from the mounting position judge circuit 71. In a correction circuit 74, the data from a displacement sensor 11 is corrected.

In a judge circuit 75, by the information from the correction circuit 74, the existence and position of an electronic component are judged. In an interface circuit 76, the conveyor unit 30, arrival sensor 35, fixer 40, sticker feeder 50, and suction head unit 60 are connected through signal cables 8.

Figure 3:
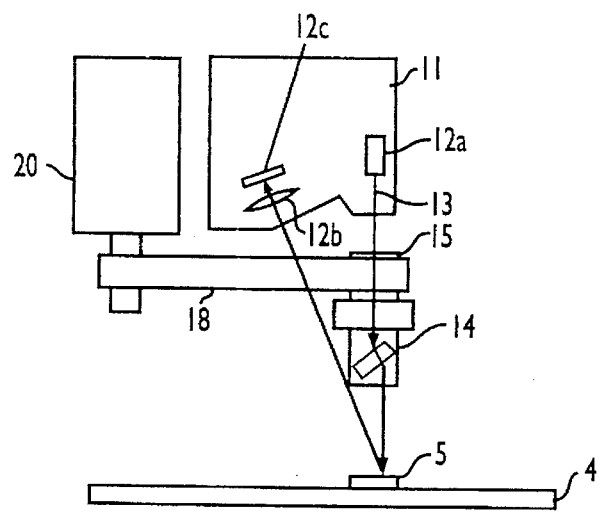
FIG. 3 is a front view showing the principle of the displacement sensor used in the same apparatus.

FIG. 3 shows the displacement sensor 11. The displacement sensor 11 measures the displacement by the trigonometric method. A laser beam 13 emitted from a light source 12a is refracted by a refractor 14 made of flat sheet glass. The refractor 14 is supported on a pipe 15. A servo motor 20 rotates the pipe 15 as required.

Numeral 12c denotes a receiver composed of multiple photoelectric transducers. The laser beam 13 emitted from the light source 12a is reflected by the circuit board 4 and electronic component 5, and passes through the lens 12b and enters the receiver 12c. Depending on the position of input of reflected light in the receiver 12c, the displacement is detected.

Figure 4:
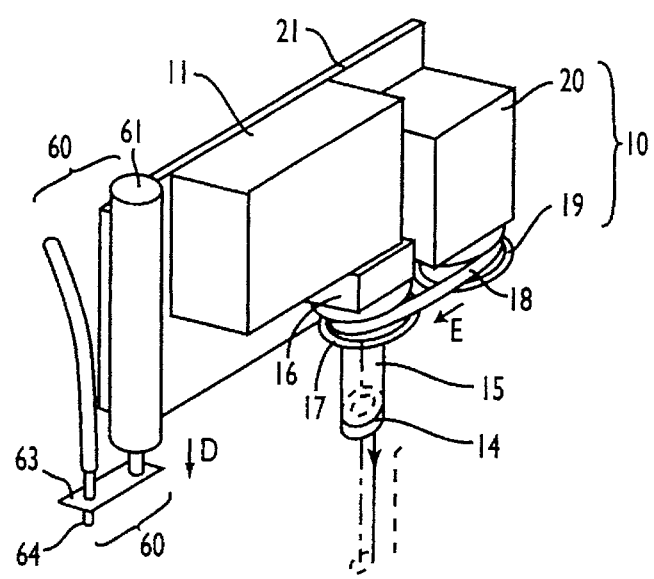
FIG. 4 is a perspective view of a sensor head showing the refracted trace of laser beam in the same apparatus.

FIG. 4 is a perspective view showing the sensor head unit 10 and suction head unit 60 mounted on the Y-axis robot 27. The displacement sensor 11 is mounted on a bracket 21.

The pipe 15 is rotatably inserted in a bearing 16. The refractor 14 is mounted on the pipe 15 at an inclination to the axial direction.

When the motor 20 rotates, the pipe 15 and refractor 14 rotate through the belt 18. Consequently, the laser beam 13 changed in optical path by the refractor 14 rotates together with the refractor 14.

The suction head unit 60 comprises a cylinder 61, a suction nozzle 64, and a bracket 63 for fixing the suction nozzle 64 and cylinder 61. The cylinder 61 moves in the direction of arrow D by air pressure, and the suction nozzle 64 moves together with the cylinder 61.

Figure 5:
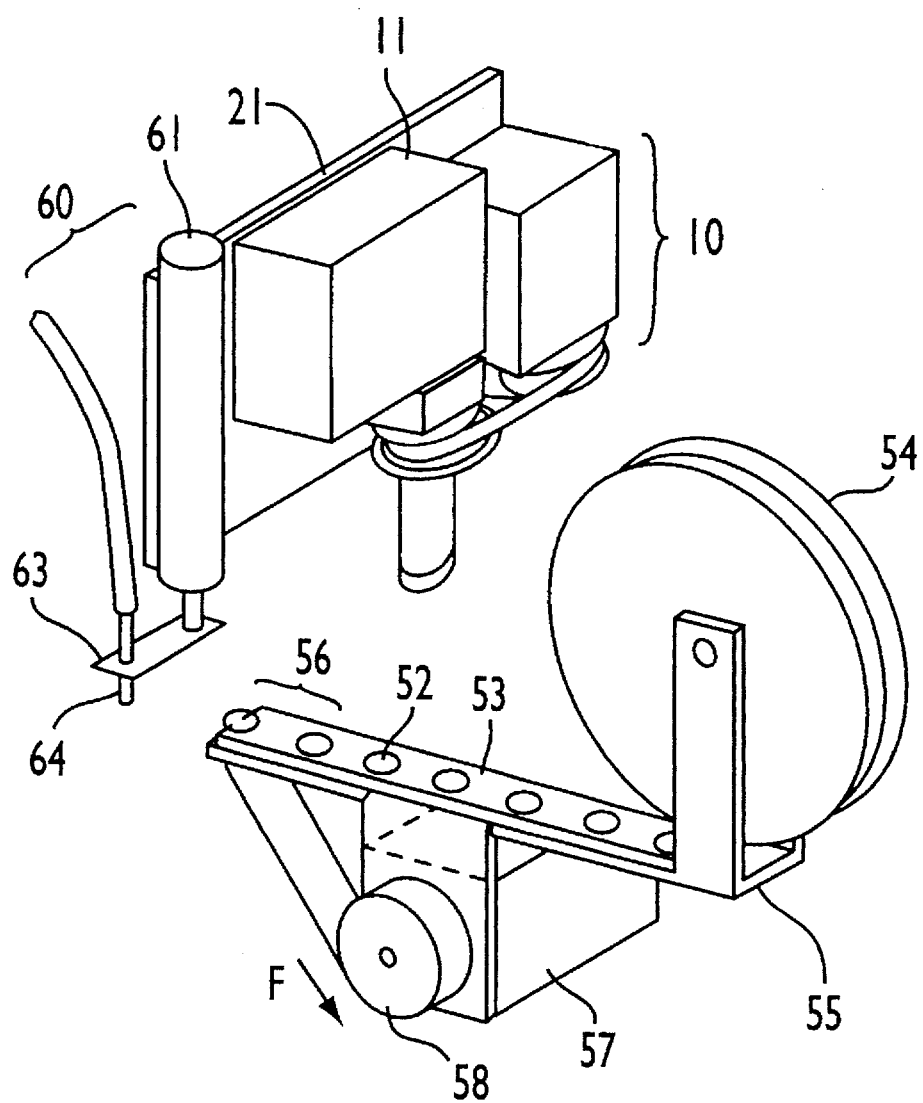
FIG. 5 is a perspective view showing the sticker feed part in the same apparatus.

FIG. 5 is a perspective view of the sticker feeder 50. The stickers 52 are adhered to a base paper 53 at specific intervals, and guided from a reel 54 to a feed stage 56. The stickers 52 are attracted to the suction nozzle 64 on the feed stage 56. The base paper 53 is taken up on a reel 58 by rotation of a motor 57.

As shown in FIG. 1, the circuit board 4 is conveyed up to the inspection stage by the conveyor unit 30, and when the arrival sensor 35 detects the arrival of the circuit board 4, the conveyor unit 30 stops. In consequence, the fixer 40 presses the circuit board 4 against the conveyor rail 38 to fix so as not to move during inspection.

Next, the position of the origin of the X-direction and Y-direction is determined. On the basis of the information possessed by the memory circuit 70 in the personal computer 2, the X-axis robot 25 and the Y-axis robot 27 move the displacement sensor 11. The displacement sensor 11 scans the circuit board 4, detects the edge of the origin hole 6, and determines its central position by calculation. The obtained central position is the position of the origin.

In the memory circuit 70 of the personal computer 2, the shape of the electronic component 5 and the origin information are stored, and according to this information, the electronic component 5 mounted on the circuit board 4 is scanned once by the displacement sensor 11. By judging the signal generated by the displacement sensor 11 by the judge circuit 75 in the personal computer 2, the existence and position of the electronic component 5 can be detected.

Furthermore, when scanning the electronic component 5, by simultaneously scanning the circuit board in its vicinity, the height of the electronic component 5 from the circuit board is detected. If defect is judged as a result of detection, the suction head unit 60 moves onto the sticker feed stage 56, and the suction nozzle 64 is lowered to suck the sticker 52. The suction head unit 60 then moves onto the defective position. The suction nozzle 64 sucking the sticker 52 descends on the electronic component 5 and cancels the suction, so that the sticker 52 is adhered to the electronic component 5. This action is repeated whenever a defect occurs.

Figure 6:
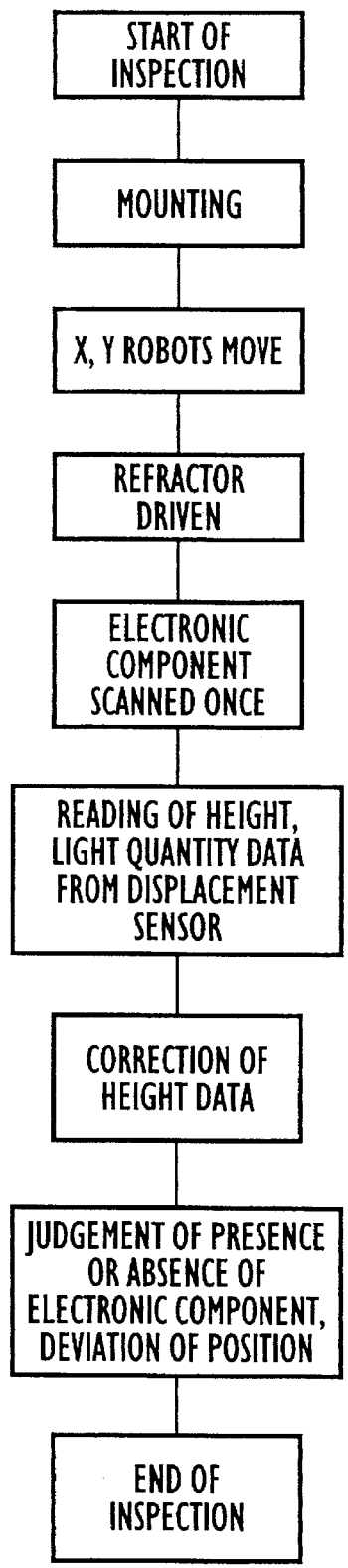
FIG. 6 is a flow chart showing the method of inspection of presence or absence and deviation of position of an electronic component in the same apparatus.

When marking is over, the fixing block 42 cancels the fixing of the circuit board. The circuit board 4 is conveyed to the next process by the conveyor unit 30. FIG. 6 is a flow chart showing this flow.

Figure 7A:
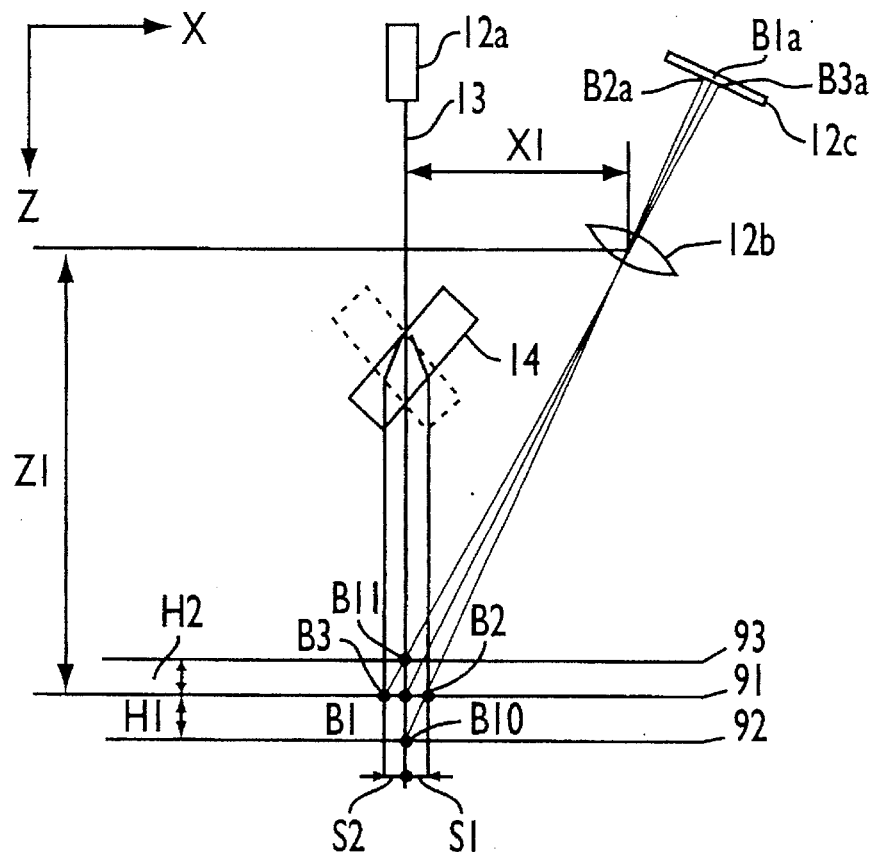
FIG. 7(a) is a conceptual diagram showing the principle of inspection of the same apparatus.
Figure 7B:
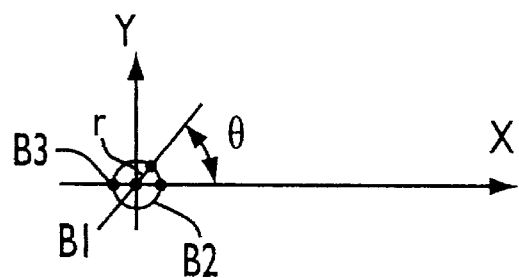
FIG. 7(b) is a plan view showing the trace of the laser beam.

As shown in FIG. 7, the laser beam 13 emitted from the light source 12a is reflected by B1 of the measuring surface 91 if the refractor 14 is not provided, and is focused on B1a on the receiver 12c through the lens 12b. When the measuring surface is 92, reflected by B10, the laser beam is focused on B2a on the receiver 12c, and by the difference of B1a and B2a, the displacement of the measuring surface 91 and measuring surface 92 is measured. When the measuring surface is 91, if the refractor 14 is at the position of solid line, the laser beam 13 is emitted to B2 according to the Snell's law. When the refractor 14 is at the position of the broken line, the laser beam 13 is emitted to B3. Therefore, by rotating the refractor 14, the trace of the laser beam 13 on the measuring surface 91 becomes as shown in FIG. 7(b).

In this way, when the refractor 14 is as indicated by solid line in FIG. 7(a), the laser beam 13 is emitted to B2. This is equivalent to emission to B10 as seen from the receiver 12c. When the refractor 14 is as indicated by broken line in FIG. 7(a), the laser beam 13 is emitted to B3. This is equivalent to emission to B11 as seen from the receiver 12c.

That is, when the refractor 14 is present, if the measuring surface is specific, the output of the displacement sensor 11 varies depending on the rotational angle $\theta$ of the refractor 14. When the refractor 14 is rotated a revolution, the output waveform of the displacement sensor 11 is 200 in FIG. 8. It is necessary to correct in order that the output of the displacement sensor 11 may not be influenced by the rotational angle $\theta$ of the refractor 14.

From the dimensions of the parts in FIG. 7(a), the following expressions are established.

$$H1/S1 = Z1/(X1-S1) \tag{1}$$

$$H2/S2 = (Z1-H2)/X1 \tag{2}$$

Herein, supposing the rightward direction in FIG. 7(a) to be the +direction of the X-coordinate, the downward direction to be the +direction of the Z-coordinate, the displacement of the later beam 13 to be S, and the change of measuring surface to be Hs, the above formulas (1) and (2) can be expressed in (3).

$$Hs = (Z1 \times S)/(X1-S) \tag{3}$$

Moreover, $$S = r \cos \theta \tag{4}$$

The distance up to the measuring surface 91 measured by the displacement sensor 11 in the presence of the refractor 14 is H, and the true distance in the absence of the refractor 14, that is, from the displacement sensor 11 to the measuring surface 91 is Z1, and hence $$H=Hs+Z1 \qquad (5)$$

Therefore, the true distance Z1 desired to be determined is expressed as follows from the formulas (3), (4), (5).

$$Z1=H(X1-r\cos\theta)/X1$$

Figure 8:
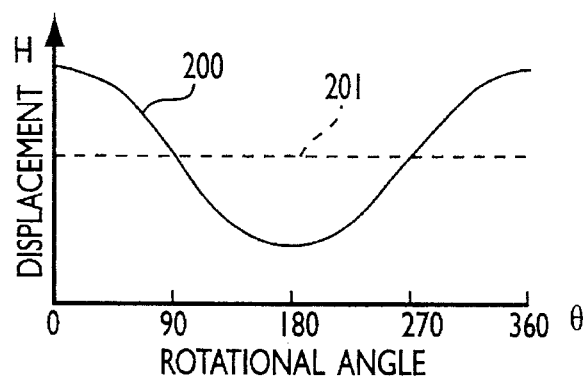
FIG. 8 is a waveform diagram showing the principle of inspection of the same apparatus.

This formula shows that the true distance Z1 can be determined by correcting the distance H up to the measuring surface 91 measured by the displacement sensor 11 by using the rotational angle θ of the refractor 14, the radius of rotation r, and distance X1. When corrected by using this formula, the output waveform of the displacement sensor 11 in FIG. 8 is 201, which is flat regardless of θ.

Figure 9A:
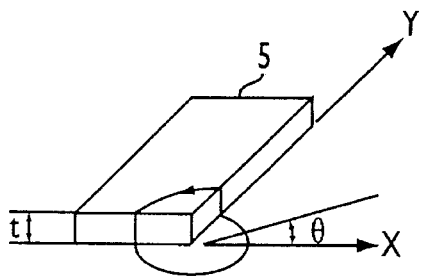
FIG. 9(a) is a perspective view showing the state of scanning over an electronic component by the laser beam in the same apparatus.
Figure 9B:
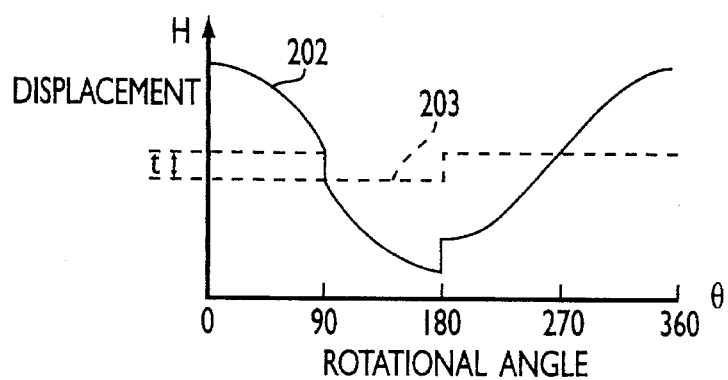
FIG. 9(b) is a waveform diagram of the same.

FIG. 9(a) shows the trace of one revolution of the laser beam 13 over the electronic component 5, and the waveform of displacement measured by the displacement sensor 11 at this time is 202 in FIG. 9(b). Correction of this waveform yields 203. As a result, the position and thickness t of the electronic component can be measured.

Figure 10:
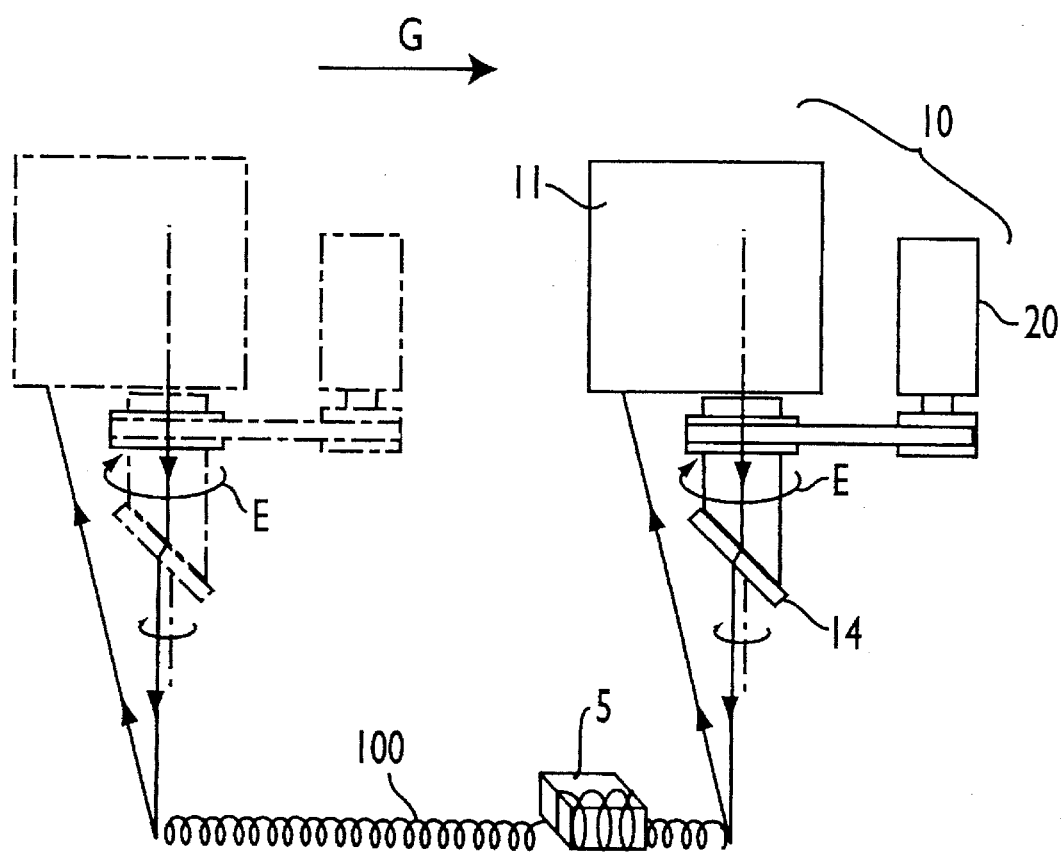
FIG. 10 is a front view showing the state of scanning over an electronic component by the sensor head unit.
Figure 11A:
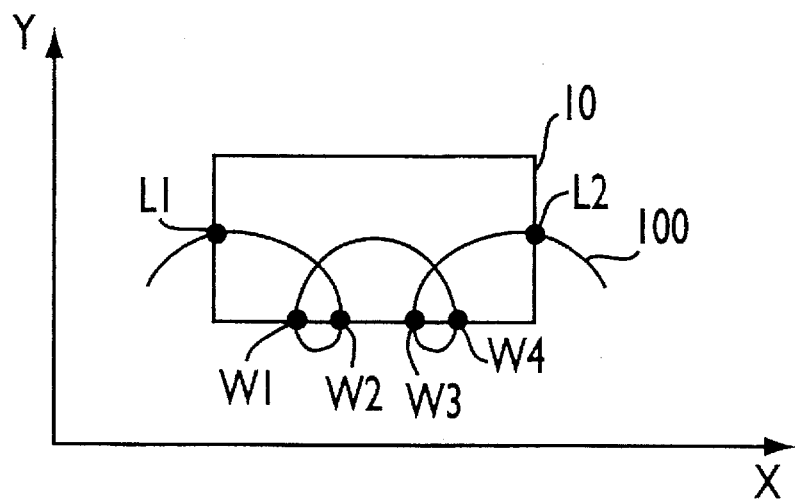
FIG. 11(a) is a plan view showing the trace of the laser beam in FIG. 10.

FIG. 10 shows the inspection of circuit board by employing such method and correction. FIG. 11 shows the trace of scanning and waveform of displacement.

As shown in FIG. 10, the displacement sensor 11 scans once over the electronic component 5 on the circuit board. The laser beam 13 is turning by the rotation of the motor 20, and hence the tracing of the laser beam 13 is spiral 100.

Figure 11B:
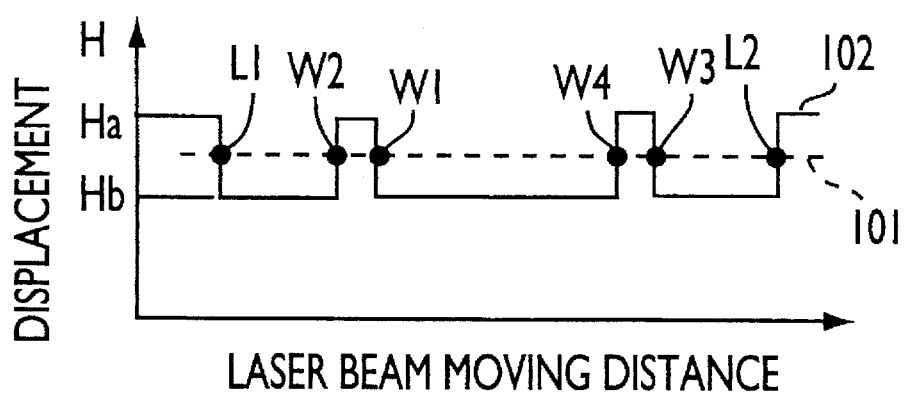
FIG. 11(b) is a waveform diagram of the height data of FIG. 10.

FIG. 11(b) shows the waveform (corrected) 102 of displacement. By setting a threshold 101 between the displacement level Hb of the circuit board 4 and the displacement level Ha of the electronic component 5, the displacement changing points L1 to 2, W1 to 4 can be detected.

Figure 12:
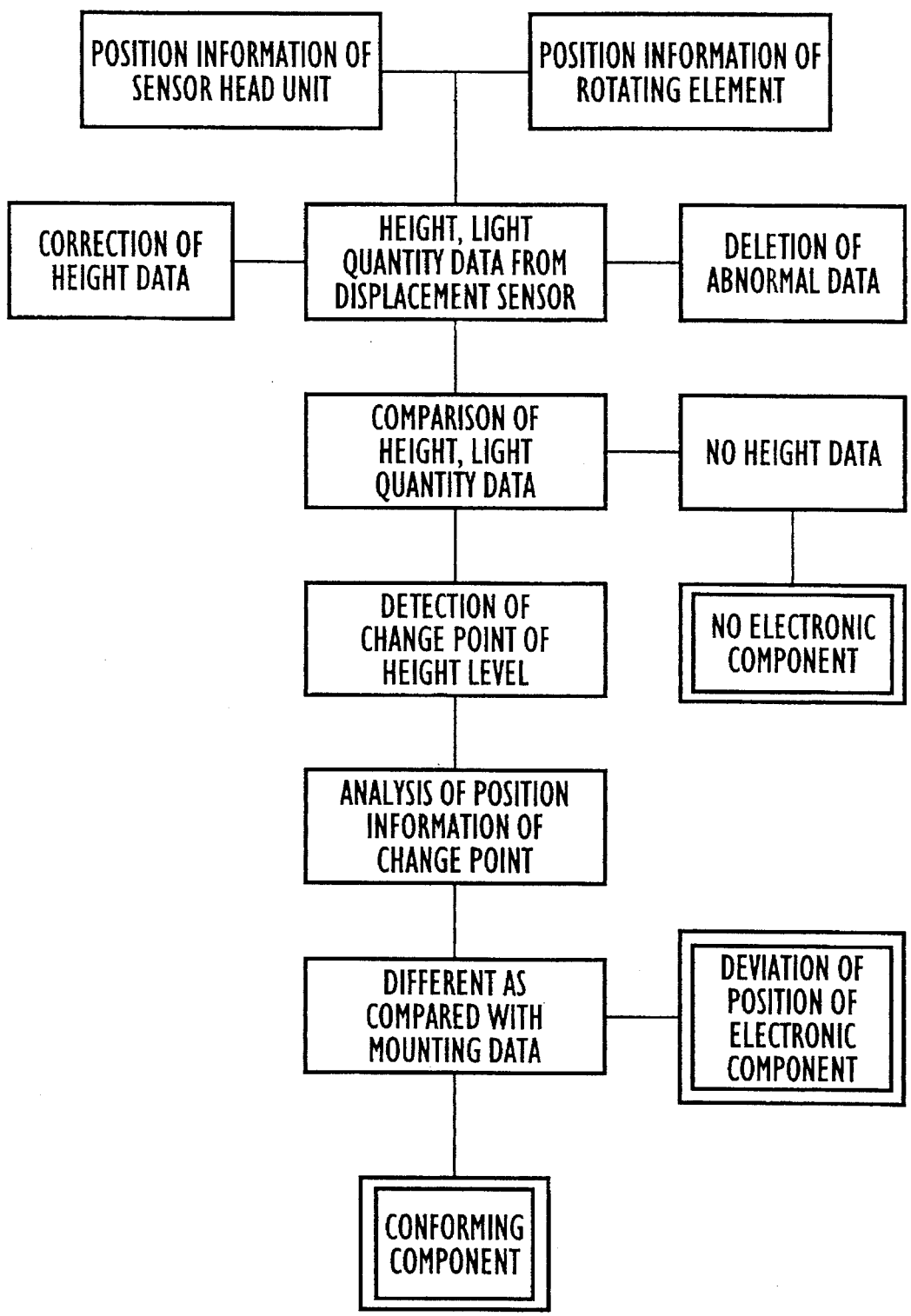
FIG. 12 is a flow chart for judging the presence or absence and deviation of position of an electronic component.

The position and height of the electronic component 5 on the circuit board 4 can be detected according to the flow chart in FIG. 12 from the positions of the displacement changing points L1 to 2, W1 to 4.

Figure 13:
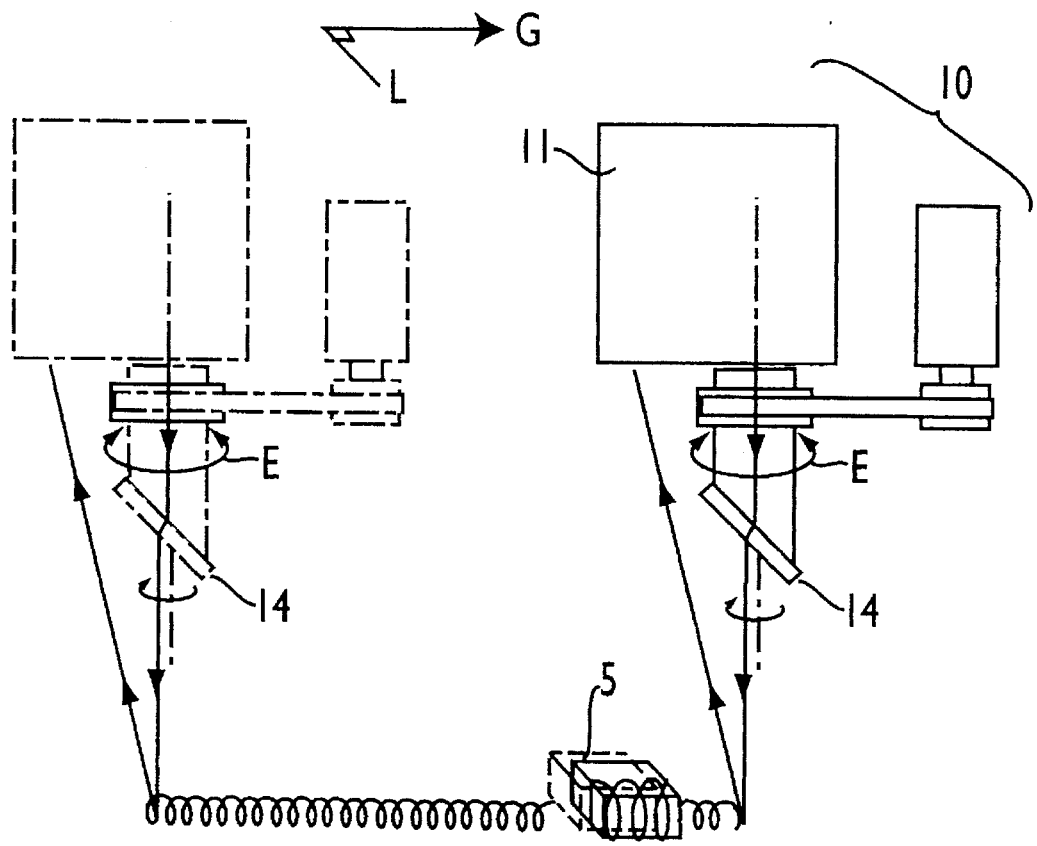
FIG. 13 is a plan view showing the state of scanning over an electronic component mounted in a wrong position by the sensor head unit of the apparatus.
Figure 14:
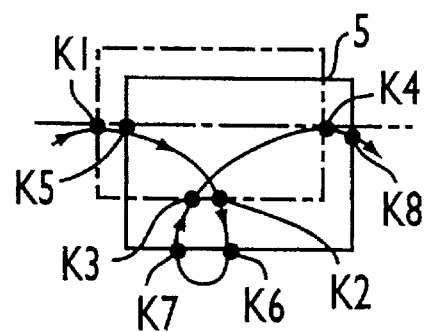
FIG. 14 is a plan view showing the trace of laser beam in FIG. 15.

FIG. 13 and FIG. 14 show the case of scanning over the electronic component 5 deviated in position in the direction of arrow L, in the direction of arrow G, by the displacement sensor 11 while rotating the refractor 14.

In the diagrams, the solid line refers to the electronic component 5 mounted at a wrong position, and the broken line indicates the correct position of the electronic component 5.

Figure 15:
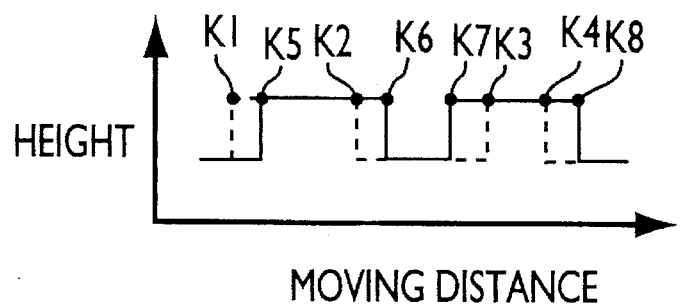
FIG. 15 is a waveform diagram of the height data in FIG. 13.

The output waveform of the displacement sensor 11 is indicated by solid line in FIG. 15, but if the position of the electronic component 5 is not deviated, it should be indicated by broken line. The waveform of broken line is obtained from the basic information stored in the memory circuit 70 in the personal computer 2, which includes the correct position information of the electronic component 5. By comparing the waveform of broken line and the waveform of solid line in FIG. 15, the deviation of position of the electronic component 5 can be detected.

EXAMPLE 2

The constitution of the exterior view inspecting apparatus for circuit board of the embodiment is same as in Example 1, and is not hence described herein.

Figure 16:
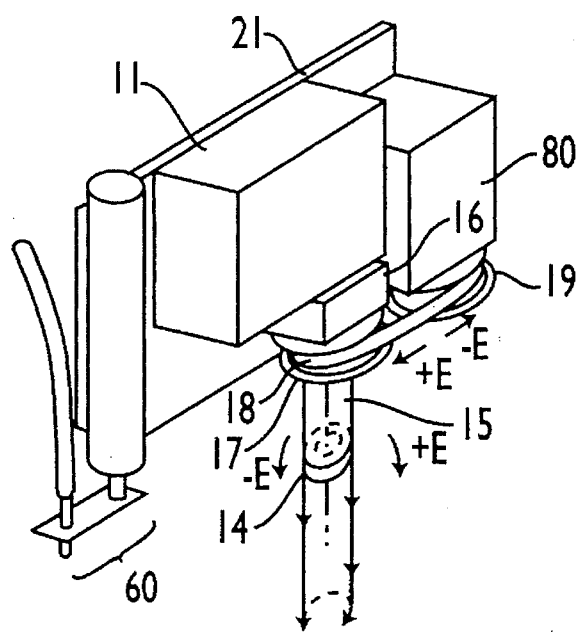
FIG. 16 is an essential perspective view showing a sensor head unit of an exterior view inspecting apparatus for circuit board in a second embodiment of the invention.

FIG. 16 shows the sensor head unit, in which the servo motor 80 rotates normally and reversely, intermittently, to drive the refractor 14.

Figure 17:
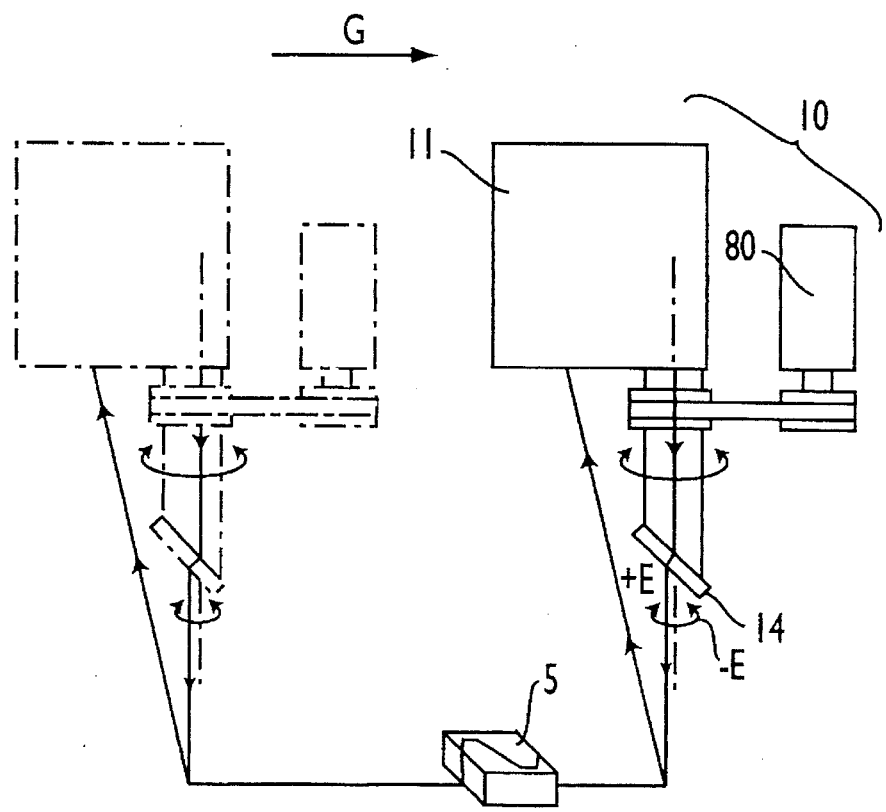
FIG. 17 is a front view showing the state of scanning over an electronic component by the sensor head unit in the same embodiment.
Figure 18:
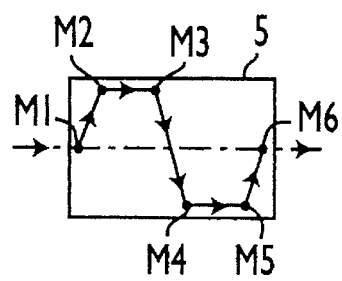
FIG. 18 is a plan view showing the trace of laser beam in FIG. 17.

In FIG. 17 and FIG. 18, the displacement sensor 11 scans once over the electronic component 5 in the direction of arrow G. By intermittent normal and reverse rotation of the servo motor, the trace of the laser beam is trapezoidal.

The basic information including the position and shape of the electronic component 5 is stored in the memory circuit 70 of the personal computer 2. The scanning route of the displacement sensor 11 is determined by the position information of the electronic component 5. The width of the trapezoid of the trace of the laser beam is set smaller than the width of the electronic component 5 by the shape information of the electronic component 5.

In FIG. 18, the refractor 14 stops before M1, rotates normally from M1 to M2, stops from M2 to M3, rotates reversely from M3 to M4, stops from M4 to M5, rotates normally from M5 to M6, and stops after M6.

Figure 19:
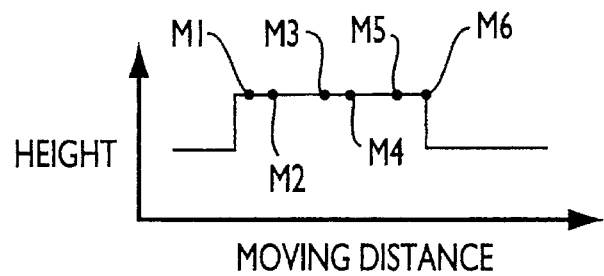
FIG. 19 is a waveform diagram showing the height data in FIG. 17.

FIG. 19 shows the waveform (corrected) of the height data delivered from the displacement sensor 11, and the height is the same from M1 to M6.

As the judge circuit 75 in the personal computer 2 judges that there is no changing point of the height level and height data, it is judged that the electronic component 5 has been mounted correctly.

If there is any changing point of the height data, by comparing with the basic information stored in the memory circuit 70 in the personal computer 2, it is inspected whether the electronic component 5 has been mounted correctly or not.

Figure 20:
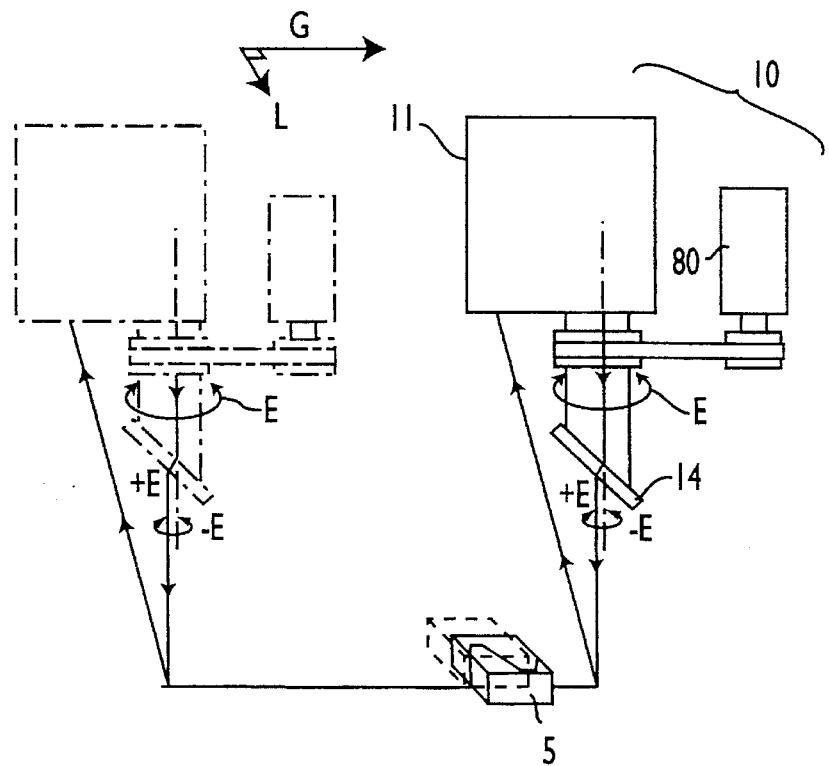
FIG. 20 is a front view showing the state of scanning over an electronic component mounted in a wrong position by the sensor head unit in the same embodiment.
Figure 21:
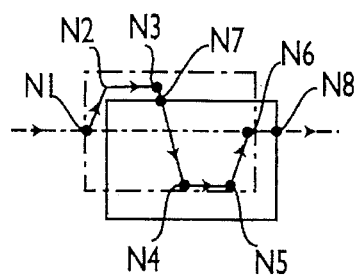
FIG. 21 is a plan view showing the trace of laser beam in FIG. 20.

FIG. 20 and FIG. 21 show the case of the displacement sensor 11 scanning over the electronic component 5 deviated in position in the direction of arrow L, in the trapezoidal trace in the direction of arrow G. In the diagram, the solid line indicates the electronic component 5 mounted in a wrong position, and the broken line shows the correct position of the electronic component 5.

Figure 22:
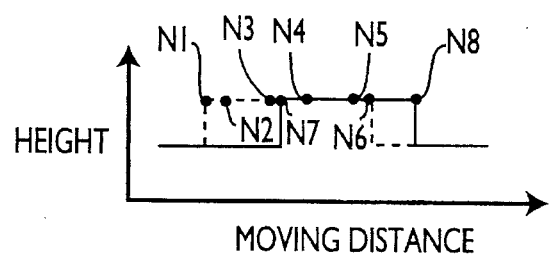
FIG. 22 is a waveform diagram of height data of the electronic component in FIG. 20.

The output waveform of the displacement sensor 11 is indicated by solid line in FIG. 22, and if there is no deviation of position in the electronic component 5, it should be indicated by broken line. The waveform of broken line can be obtained from the basic information stored in the memory circuit 70 in the personal computer, this information containing the correct position information of the electronic component 5. By comparing the waveform of broken line and the waveform of solid line in FIG. 22, the deviation of position of the electronic component can be detected.

In the embodiment, the trace of the laser beam is trapezoidal, but it may be also sinusoidal wave, triangular wave, or sawtooth wave.

EXAMPLE 3

The constitution of the exterior view inspecting apparatus for circuit board of this embodiment is same as in Example 1, and is not described herein.

Figure 23:
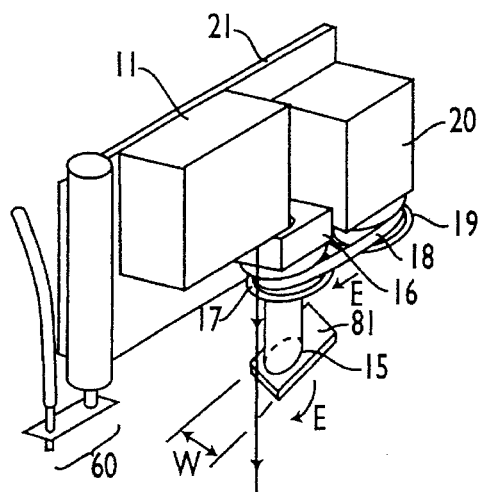
FIG. 23 is an essential perspective view showing a sensor head unit of an exterior view inspecting apparatus for circuit board in a third embodiment of the invention.

FIG. 23 shows a sensor head unit. Parallel to the laser beam emitted from the displacement sensor 11, the pipe 15 coupled with the pulley 17 is rotatably installed. The motor 20 rotates the pipe 15 through a belt 18. On the pipe 15, a refractor 81 having a width W is mounted at an inclination in the axial direction.

Figure 24:
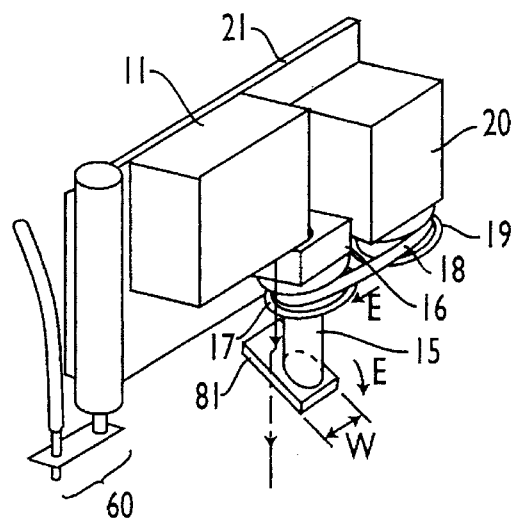
FIG. 24 is an essential perspective view showing the trace of refracted laser beam in the same embodiment.

As shown in FIG. 24, the laser beam emitted from the displacement sensor 11 is intermittently interrupted by the rotation of the refractor 81, and the optical path is changed. That is, when the refractor 81 is positioned in the optical path of the laser beam, the laser beam is refracted.

Figure 25:
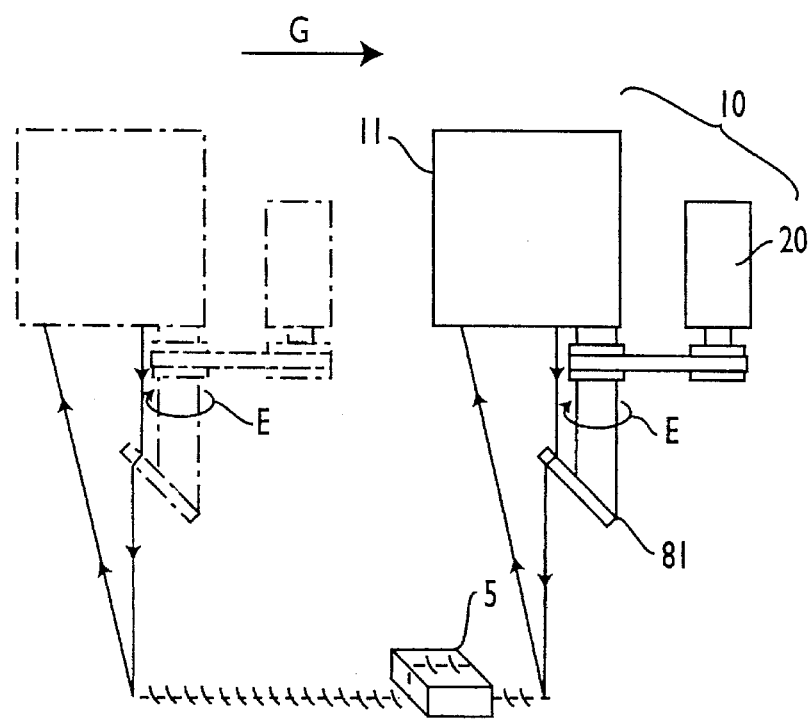
FIG. 25 is a front view showing the state of scanning over an electronic component by the sensor head unit in the same embodiment.
Figure 26:
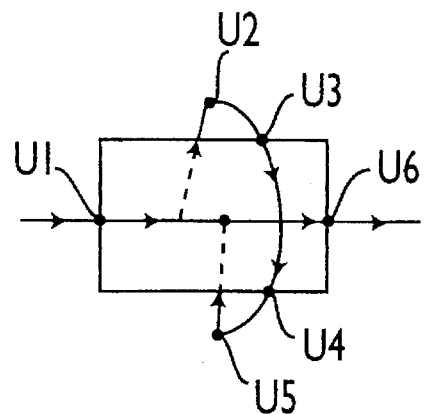
FIG. 26 is a plan view showing the trace of the laser beam in FIG. 25.

As shown in FIG. 25, the displacement sensor 11 scans over the electronic component 5 mounted on the circuit board 5 once in the direction of arrow G. As mentioned, above, the laser beam is refracted by the refractor 81 when the refractor 81 is on the optical path, and passing over the electronic component 5, while rotating in the same direction as the refractor 81. FIG. 26 shows the trace of the laser beam.

Of the output of the displacement sensor 11, the laser beam is corrected in the correction circuit 74 in the personal computer 2 by the portion refracted by the refractor 81.

Figure 27:
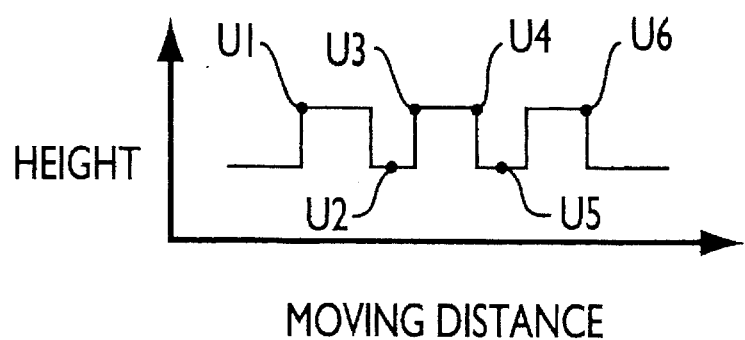
FIG. 27 is a waveform diagram of height data of the electronic component in FIG. 25.
Figure 28:
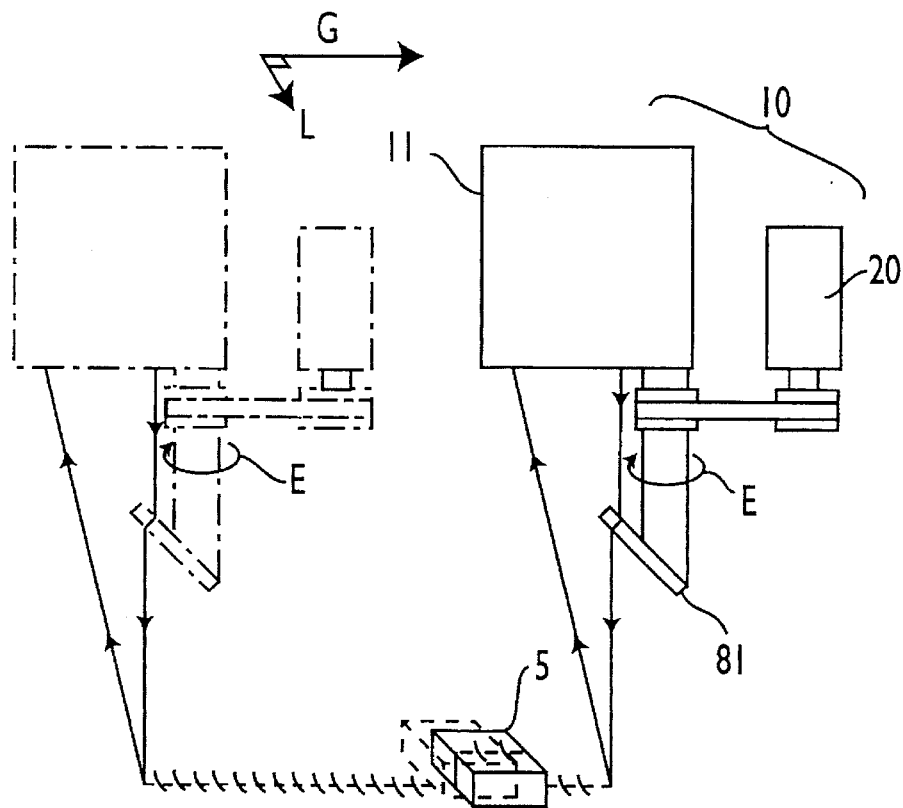
FIG. 28 is a front view showing the state of scanning over an electronic component mounted in a wrong position by the sensor head unit in the same embodiment.
Figure 29:
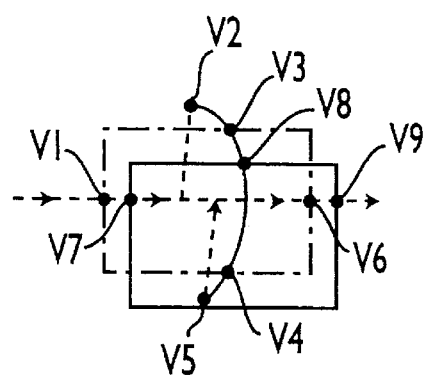
FIG. 29 is a plan view showing the trace of the laser beam in FIG. 28.
Figure 30:
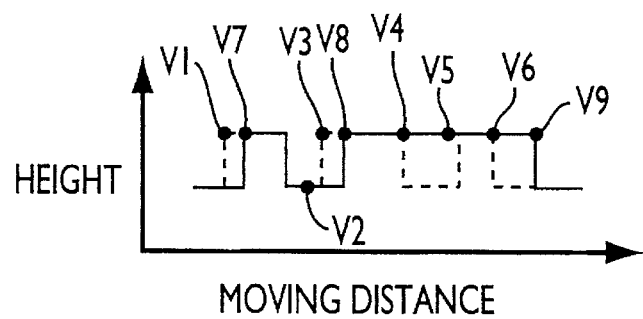
FIG. 30 is a waveform diagram of height data of the electronic component in FIG. 28.

FIG. 27 shows the waveform of the height data (corrected) issued from the displacement sensor 11.

By comparing the changing point of the height level and height data with the basic information stored in the memory circuit 70 in the personal computer 2, the judge circuit 75 in the personal computer 2 detects the existence and position of the electronic component 5, and inspects if the electronic component 5 has been mounted correctly or not.

EXAMPLE 4

The constitution of the exterior view inspecting apparatus for circuit board in the embodiment is same as in Example 1, and is not described herein.

Figure 31:
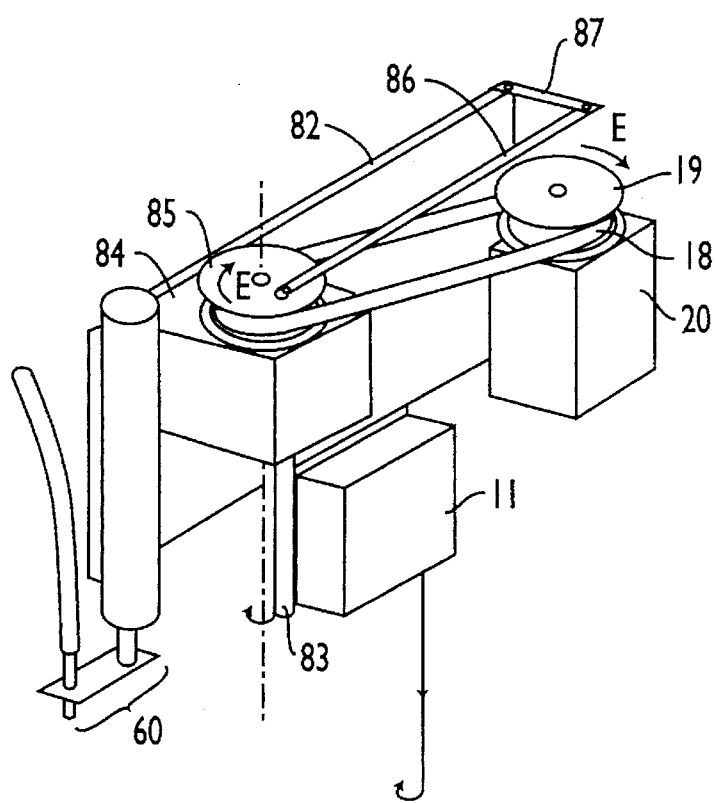
FIG. 31 is an essential perspective view showing a sensor head unit of an exterior view inspecting apparatus for circuit board in a fourth embodiment of the invention.

FIG. 31 shows the sensor head unit. The displacement sensor 11 is fixed through a bar 83 rotatably held on a pulley 85 by a bearing (not shown). One end of a lever 86 is fixed to the bar 83, while the other end of the lever 86 is rotatably coupled with one end of a lever 87. The displacement sensor 11 always indicates nearly the same direction as the lever 86. The other end of the lever 87 is rotatably coupled with a bracket 82.

By the rotation of the motor 20, the pulley 85 is rotated, and the bar 83 rotates together with the pulley 85. The displacement sensor 11 moves together with the bar 83, while indicating nearly the same direction as the lever 86.

Figure 32:
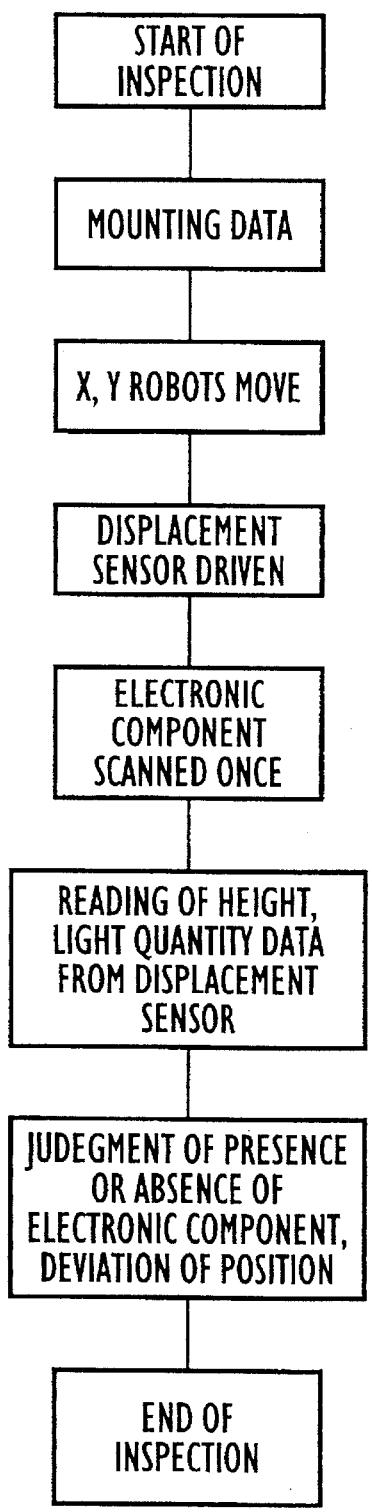
FIG. 32 is a flow chart showing the method of inspection of presence or absence and deviation of position of an electronic component in the same embodiment.
Figure 33:
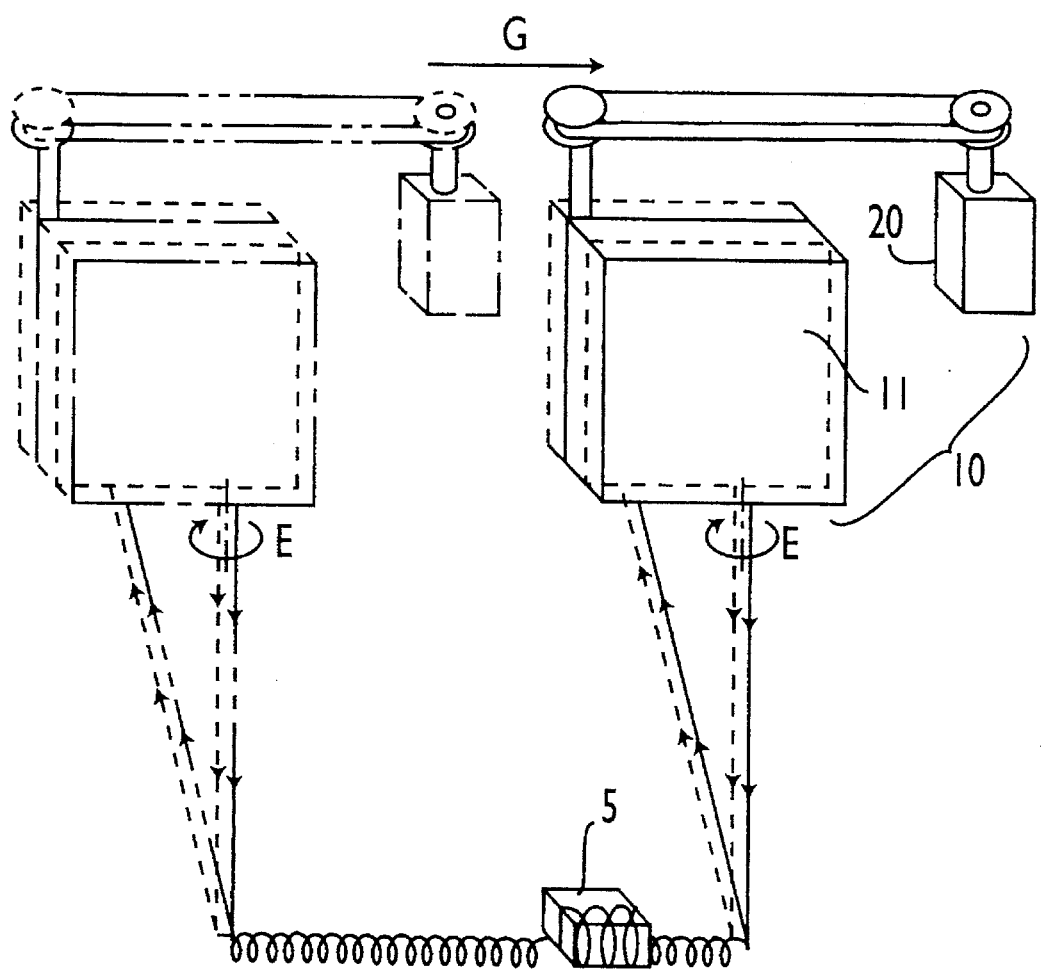
FIG. 33 is a perspective view showing the state of scanning over an electronic component by the sensor head unit in the same embodiment.

In FIG. 33, the displacement sensor 11 scans over the electronic component 5 once in the direction of G while rotating in the direction of arrow E. The measured data obtained from the displacement sensor 11 is fed into the personal computer 2. However, since the optical path of the laser beam is not changed by the refractor, it is not necessary to correct the measured data as shown in the flow chart in FIG. 32. The waveform of the trace and height data of laser beam is same as in FIG. 11 relating to Example 1.

In this embodiment, meanwhile, since it is not necessary to correct the height data, the calculation time is short and it is efficient. To heighten the precision of inspection in the embodiment, meanwhile, needless to say, it is better to increase the rotating speed of the laser beam.

EXAMPLE 5

The constitution of the exterior view inspecting apparatus for circuit board in the embodiment is same as in Example 1, and is not described herein.

Figure 34A:
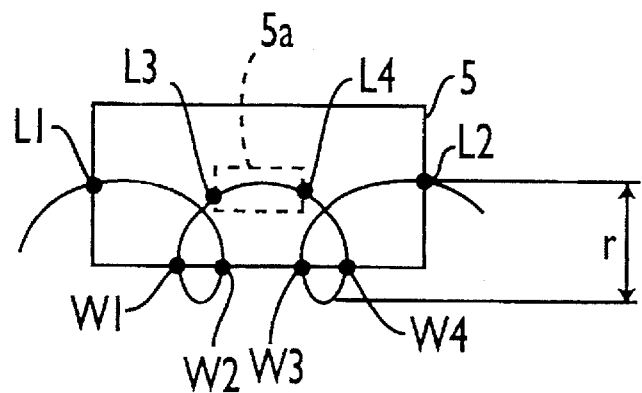
FIG. 34(a) is a plan view showing a scanning example of a sensor head unit in a fifth embodiment of the invention.
Figure 34B:
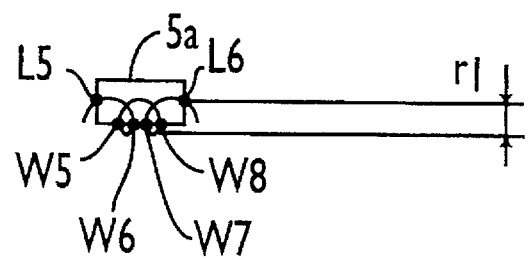
FIG. 34(b) is a plan view showing a scanning example in the case of varying the radius of rotation of the same laser beam.
Figure 35:
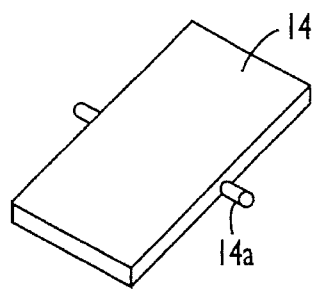
FIG. 35 is a perspective view explaining the angle variable mechanism of a flat sheet glass in the same embodiment.

The electronic component 5 in the dimensions indicated by solid line in FIG. 34(a) can be measured by laser beam having the trace in the diameter of r. However, the electronic component 5 of smaller size in the dimensions indicated by broken line cannot be measured by the laser light having the trace in the diameter of r. The diameter of the trace of the laser beam can be changed by the inclination angle of the refractor. In this embodiment, by attaching the axis 14a for rotation to the refractor 14, the inclination angle of the refractor can be changed. The diameter of the trace of the laser beam is r1 as shown in FIG. 34(b), so that the electronic component 5 of smaller size in the dimension indicated by broken line can be measured. The mechanism for rotating the refractor 14 may be a known mechanism, and the description is omitted.

EXAMPLE 6

The constitution of the exterior view inspecting apparatus for circuit board in the embodiment is same as in Example 1, and is not described herein.

Figure 36A:
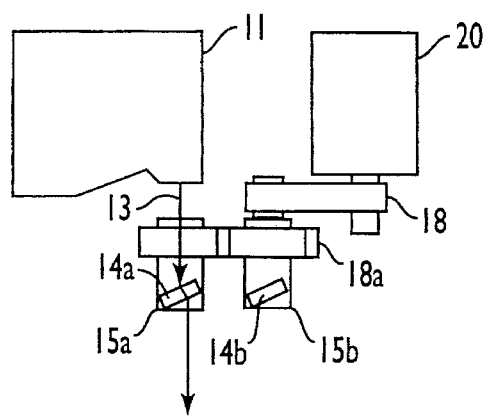
FIG. 36(a) is an essential side view showing the detail of a sensor head unit in a sixth embodiment of the invention.
Figure 36B:
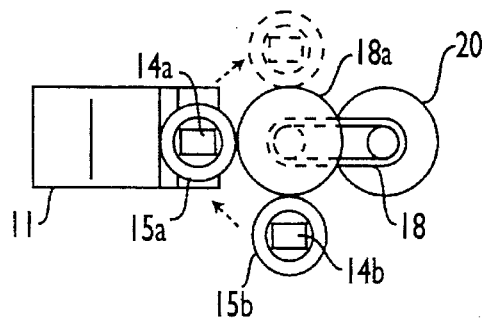
FIG. 36(b) is its bottom view.

In FIG. 36(a), (b), the motor 20 rotates the refractors 14a and 14a provided in pipes 15a and 15b through a drum 18a. The inclination angle differs between the refractors 14a and 14b, and the refractor 14a refracts the laser beam 13. In FIG. 36(b), when the pipe 15a comes to the position indicated by broken line by a mechanism not shown herein, and the pipe 15b at the position once occupied by the pipe 15a, the diameter of the trace of the laser beam can be varied.

EXAMPLE 7

Figure 37:
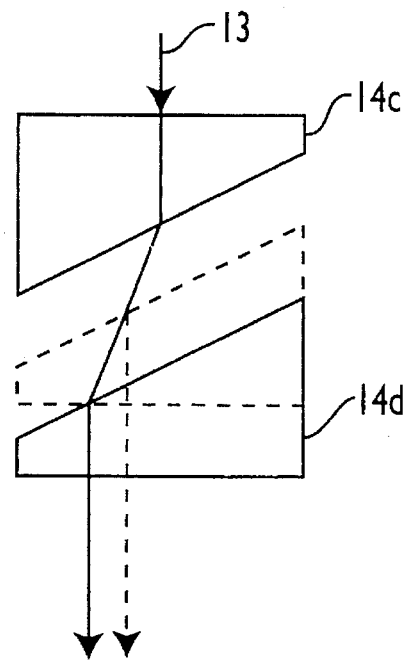
FIG. 37 is a side view showing the means for varying the radius of rotation in a seventh embodiment of the invention.
Figure 38:
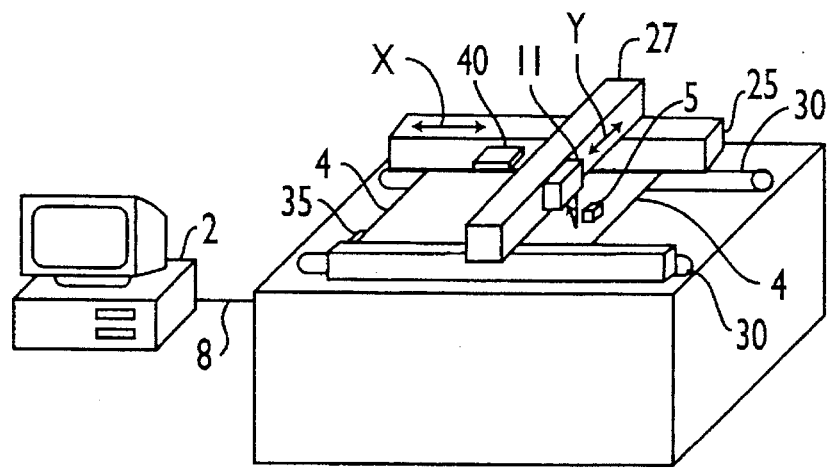
FIG. 38 is a perspective view showing the constitution of a conventional exterior view inspecting apparatus for circuit board.
Figure 39:
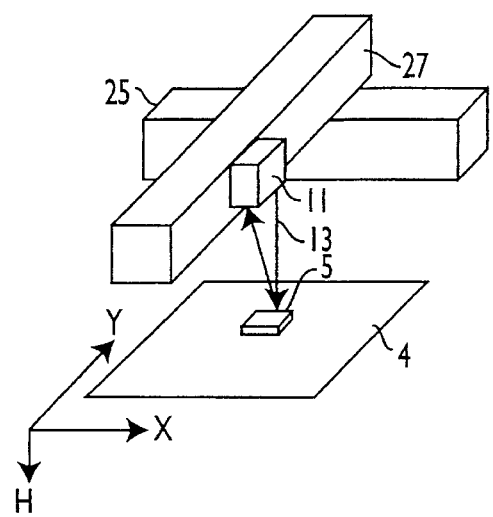
FIG. 39 is an essential perspective view showing the state of scanning over an electronic component by a displacement sensor in FIG. 38.
Figure 40A:
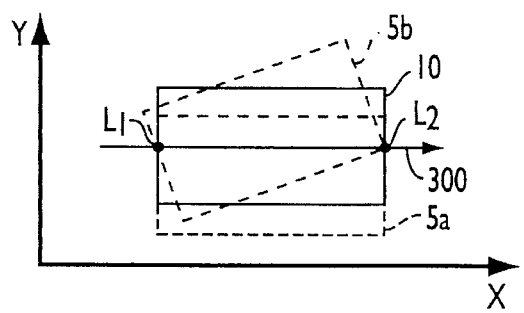
FIG. 40(a) is a plan view showing the trace after scanning in FIG. 39.
Figure 40B:
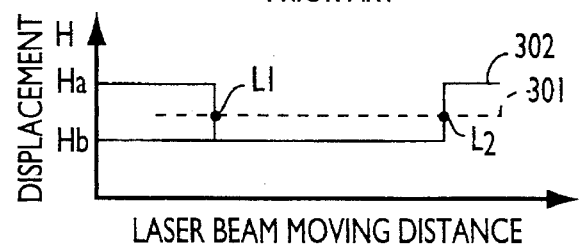
FIG. 40(b) is a waveform diagram of the same height data.

Instead of the refractor 14, by varying the interval of the pair of trapezoidal glass sheets 14c and 14d shown in FIG. 37, the diameter of the trace of the laser beam can be varied, same as in Example 6.

What is claimed is:

1. An exterior view inspecting apparatus for circuit board comprising:

a sensor unit for emitting a laser beam to an object to be inspected, and detecting a position of an electronic component on a circuit board by focusing a reflected light on a photoelectric transducer by using a receiving lens, at least one optical path converter unit comprising a flat sheet glass inclined to the optical path of the laser beam for refracting an optical path of the laser beam, the optical path of the laser beam is perpendicular to the object to be inspected after passing through said at least one optical path converter, means which rotates the flat sheet glass so that the laser beam scans an object to be inspected drawing a small circular trace, a sensor head unit incorporating the sensor unit and the at least one optical path converter unit, a control unit for moving the sensor head unit along a specified scanning route, a memory means for storing a correct position information of the object to be inspected, a correction unit for obtaining the corrected position data Z1 by correcting data H regarding the position of the object as detected by the sensor unit using the expression:

$$Z1 = H(X1 - r \cos \theta / X1$$

wherein:

X1 equals a distance between the laser beam and the receiving lens, r equals a radius of a circular trace of the laser beam, θ equals a rotation angle of the laser beam on the circular trace, a judging unit for judging the existence and position of the electronic component on the circuit board from the comparison between the corrected position data and the correct position information stored in the memory means.

2. An exterior view inspecting apparatus for circuit board of claim 1, wherein said flat sheet glass in the at least one optical path converter unit rotates at least in one rotation mode out of three modes, continuous rotation, intermittent rotation, and intermittent inversion, around an axial center parallel to the optical path of the laser beam.

3. An exterior view inspecting apparatus for circuit board of claim 1, wherein said flat sheet glass in the at least one optical path converter unit moves in and out of the optical path of the laser beam, and refracts the optical path of the laser beam when the flat glass sheet is in the optical path of the laser beam.

4. An exterior view inspecting apparatus for circuit board of claim 1, further comprising:

means for adjusting the inclination of the flat sheet glass relative to the optical path of the laser beam, the refraction of the optical path changes corresponding to the inclination of the flat sheet glass.

5. An exterior view inspecting apparatus for circuit board of claim 1, further comprising:

the at least one optical path converter unit comprising a plurality of optical path converter units each having a different refraction, and means for disposing selectively one of the plurality of optical path converter units on the optical path of the laser beam.

6. An exterior view inspecting apparatus for circuit board of claim 5, wherein said flat glass in the optical path converter unit disposed on the optical path of the laser beam rotates at least in one rotation mode out of three modes, continuous rotation, intermittent rotation, and intermittent inversion, around an axial center parallel to the optical path of the laser beam.

7. An exterior view inspecting apparatus for circuit board of claim 5, said flat sheet glass in the optical path converter unit disposed on the path of the laser beam moves in and out of the optical path of the laser beam, and refracts the optical path of the laser beam when the flat glass sheet is in the optical path of the laser beam.

8. An exterior view inspecting apparatus for circuit board of claim 5, further comprising:

means for adjusting the inclination of the flat sheet glass of the optical path converter unit disposed on the path of the laser beam relative to the optical path of the laser beam, the refraction of the optical path changes corresponding to the inclination of the flat sheet glass.

9. An exterior view inspecting apparatus for circuit board comprising:

a sensor unit for emitting a laser beam to an object to be inspected, and detecting a position of an electronic component on a circuit board by focusing a reflected light on a photoelectric transducer by using a receiving lens, an optical path converter unit comprising a pair of glass blocks having confronting slopes on the optical path of the laser beam for refracting an optical path of the laser beam, the optical path of the laser beam is perpendicular to the object to be inspected after passing through said optical path converter; and means which changes a distance between the pair of glass blocks, means which rotates the pair of glass blocks so that the laser beam scans an object to be inspected drawing a small circular trace, a sensor head unit incorporating the sensor unit and the optical path converter unit, a control unit for moving the sensor head unit along a specified scanning route, a memory means for storing a correct position information of the object to be inspected, a correction unit for obtaining the corrected position data Z1 by correcting data H regarding the position of the object as detected by the sensor unit using the expression:

$$Z1 = H(X1 - r \cos \theta)/X1$$

wherein:

X1 equals a distance between the laser beam and the receiving lens, r equals a radius of a circular trace of the laser beam, θ equals a rotation angle of the laser beam on the circular trace, a judging unit for judging the existence and position of the electronic component on the circuit board from the comparison between the corrected position data and the correct position information stored in the memory means.

\* \* \* \* \*